United States Patent
Zhou et al.

(10) Patent No.: US 12,417,585 B2
(45) Date of Patent: Sep. 16, 2025

(54) CONTENT CREATION PLATFORM FOR XR DEVICES

(71) Applicant: Snap Inc., Santa Monica, CA (US)

(72) Inventors: Kai Zhou, Wiener Neudorf (AT); Dunxu Hu, Venice, CA (US); Dominik Schnitzer, Vienna (AT)

(73) Assignee: Snap Inc., Santa Monica, CA (US)

( * ) Notice: Subject to any disclaimer, the term of this patent is extended or adjusted under 35 U.S.C. 154(b) by 160 days.

(21) Appl. No.: 18/065,180

(22) Filed: Dec. 13, 2022

(65) Prior Publication Data

US 2024/0193870 A1 Jun. 13, 2024

(51) Int. Cl.
*G06T 19/00* (2011.01)
*G06F 3/01* (2006.01)
(Continued)

(52) U.S. Cl.
CPC ............ *G06T 19/003* (2013.01); *G06F 3/017* (2013.01); *G06F 30/20* (2020.01); *G06T 15/50* (2013.01); *G06F 3/011* (2013.01)

(58) Field of Classification Search
CPC ....... G06T 19/003; G06T 15/50; G06F 3/017; G06F 30/20; G06F 3/011
See application file for complete search history.

(56) References Cited

U.S. PATENT DOCUMENTS

2016/0004318 A1* 1/2016 Morey .................... G06F 3/038
345/156
2018/0268256 A1* 9/2018 Di Febbo ............. G06V 10/757
(Continued)

FOREIGN PATENT DOCUMENTS

KR 20150084925 7/2015
KR 20190021747 3/2019
(Continued)

OTHER PUBLICATIONS

Bansall et al, An efficient technique for object recognition using Shi-Tomasi corner detection algorithm, 2020, Springer-Verlag (Year: 2020).*

(Continued)

*Primary Examiner* — YuJang Tswei
(74) *Attorney, Agent, or Firm* — Schwegman Lundberg & Woessner, P.A.

(57) ABSTRACT

A content creation system for extended Reality (XR) systems. The content creation system receives motion data of an XR device and generates trajectory data of a trajectory within a 3D environment model of a real-world scene based on the motion data where the trajectory simulates the motion of the XR device within the real-world scene. The content creation system receives user interaction event data and generates simulated sensor data based on the trajectory data, the 3D environment model, and the user interaction event data. The content creation system generates simulated tracking data based on the simulated sensor data and determines simulated power consumption data and thermal condition data based on operation of the computer vision component while generating the simulated tracking data. The content creation system generates a display from a user's perspective of the 3D environment model along with the simulated power consumption and thermal data.

20 Claims, 11 Drawing Sheets

(51) Int. Cl.
    *G06F 30/20*     (2020.01)
    *G06T 15/50*     (2011.01)

(56) References Cited

U.S. PATENT DOCUMENTS

| | | | |
|---|---|---|---|
| 2018/0300897 A1* | 10/2018 | Woods | G06T 7/74 |
| 2019/0303759 A1* | 10/2019 | Farabet | G05D 1/00 |
| 2020/0379034 A1* | 12/2020 | Khandhar | G06F 30/20 |
| 2021/0034172 A1 | 2/2021 | Li | |
| 2021/0149465 A1* | 5/2021 | Hiltner | G06F 1/206 |
| 2021/0255611 A1* | 8/2021 | McGregor | G06T 13/20 |
| 2022/0092862 A1* | 3/2022 | Faulkner | G06V 40/10 |
| 2022/0101593 A1* | 3/2022 | Rockel | G06T 15/10 |
| 2022/0129066 A1 | 4/2022 | Zahnert et al. | |
| 2022/0214743 A1* | 7/2022 | Dascola | G06F 3/017 |
| 2022/0317776 A1* | 10/2022 | Sundstrom | G06F 3/017 |
| 2023/0336865 A1* | 10/2023 | Da Veiga | G06F 3/0488 |

FOREIGN PATENT DOCUMENTS

| | | |
|---|---|---|
| KR | 20200052693 | 5/2020 |
| WO | 2024129586 | 6/2024 |

OTHER PUBLICATIONS

Hagel et al, Fingerprint matching—hard cases, 2016, LTH (Year: 2016).*

"International Application Serial No. PCT/US2023/083358, International Search Report mailed Apr. 16, 2024", 3 pgs.

"International Application Serial No. PCT/US2023/083358, Written Opinion mailed Apr. 16, 2024", 3 pgs.

\* cited by examiner

CONTENT CREATION PLATFORM FOR XR DEVICES

TECHNICAL FIELD

The present disclosure relates generally to user interfaces and more particularly to user interfaces used for augmented or virtual reality.

BACKGROUND

A head-wearable XR device may be implemented with a transparent or semi-transparent display through which a user of the head-wearable XR device can view the surrounding environment. Such devices enable a user to see through the transparent or semi-transparent display to view the surrounding environment, and to also see objects (e.g., virtual objects such as a rendering of a 2D or 3D graphic model, images, video, text, and so forth) that are generated for display to appear as a part of, and/or overlaid upon, the surrounding environment. This is typically referred to as "augmented reality" or "AR." A head-wearable XR device may additionally completely occlude a user's visual field and display a virtual environment through which a user may move or be moved. This is typically referred to as "virtual reality" or "VR." In a hybrid form, a view of the surrounding environment is captured using cameras, and then that view is displayed along with augmentation to the user on displays that occlude the user's eyes. As used herein, the term extended Reality (XR) refers to augmented reality, virtual reality and any hybrids of these technologies unless the context indicates otherwise.

XR system having a head-wearable XR device may have a limited battery capacity to perform operations associated with providing an XR experience to a user. In addition, some prolonged operations may generate heat that is difficult to dissipate in a head-wearable XR device causing the head-wearable XR device to become too hot for a user to wear comfortably.

BRIEF DESCRIPTION OF THE SEVERAL VIEWS OF THE DRAWINGS

In the drawings, which are not necessarily drawn to scale, like numerals may describe similar components in different views. To easily identify the discussion of any particular element or act, the most significant digit or digits in a reference number refer to the figure number in which that element is first introduced. Some non-limiting examples are illustrated in the figures of the accompanying drawings in which.

DETAILED DESCRIPTION

Figure 1:
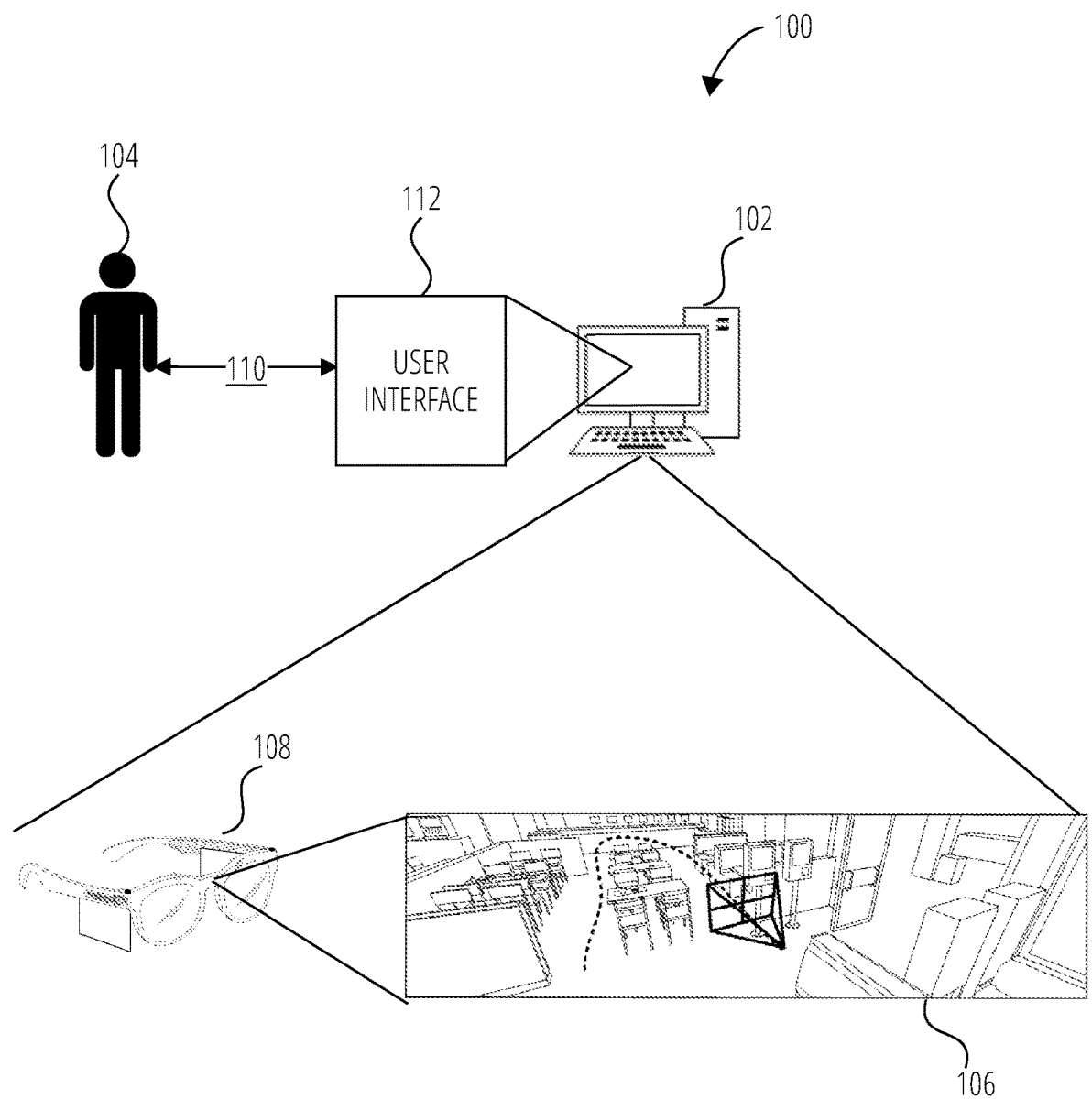
FIG. 1 illustrates a content creation computing environment, in accordance with some examples.

Developing immersive XR system applications differs with development of mobile applications or autonomous automobile applications, in terms of spatial concerns, user interaction methods, and resource constraints. In order to develop immersive XR applications for XR devices, content creators take spatial, user interactions, and resource constraints into consideration simultaneously. Spatial changes, such as moving from indoor to outdoor or vice versa, can trigger underlying algorithm response and hardware configuration changes, thereby impacting user interaction and resource usage. User interactions (e.g., hand gesture recognition, touch pad events and the like) can be influenced by various hardware (e.g., multiple camera sensors) adaption, therefore leading to different power usage over time. As an embedded system, an XR device is a resource constrained device. Battery usage and thermal distribution can be varied when the applications communicate, interact, and function in different ways.

Ideally, a content creator could consider underlying Computer Vision (CV) algorithms and Hardware/Operating System (HW/OS) configurations as a black box and test or run an XR application with all virtual event simulation. However in reality, CV algorithm performance and HW conditions dramatically when an XR device is being moved by a user while under limited power and thermal thresholds and it may be advantageous to adjust functionality of the XR application based on a real-world environment. In addition, services that support the XR application may be faced with managing spatial related use cases, such as XR navigation switching between indoor and outdoor user. Therefore, it is desirable to formulate related sensor simulations and OS emulation into a structured format, aligned with various spatial related events provided as presets to a content creator, within an application development platform dedicated to the development of applications for XR wearable devices. A content creation platform, empowered by comprehensive hardware and OS simulation, can provide developer a compact solution to tackle spatial changes, user interactions and resource constraints for developing, testing, benchmarking, and debugging XR applications.

In some examples, a content creation platform receives motion data of a motion of an XR device and generates trajectory data of a trajectory within a virtual 3D environment represented by a 3D environment model of a real-world scene base on the motion data where the trajectory simulating the motion of the XR device within the real-world scene. The content creation platform also receives user interaction event data. A data simulation platform generates simulated sensor data based on the trajectory data, the 3D environment model, and the user interaction event data. A computer vision component within an operating system emulator generates simulated tracking data based on the simulated sensor data. The operating system emulator determines simulated power consumption data and simulated thermal condition data based operation of the computer vision component while generating the simulated tracking data. The content creation platform provides to a user the simulated power consumption data and simulated thermal condition data using a user interface.

In some examples, receiving motion data of the XR device includes capturing the data of the motion of the XR device as the XR device is moved through a real-world scene by a user.

In some examples, receiving motion data of the XR device includes selecting the motion data from a listing of stored data.

In some examples, the user interaction event is associated with a time event.

In some examples, the user interaction event is associated with a location within the real-world scene.

In some examples, the user interaction event is a gesture made by a user.

In some examples, generating the trajectory data of the trajectory within the 3D environment model further includes changing an illumination parameter of the 3D environment model.

In some examples, the simulated sensor data includes camera data, Inertial Motion Unit data, and Global Positioning Sensor data.

In some examples, the simulated tracking data includes device pose data and hand recognition result data.

In some examples, generating simulated tracking data based on the simulated sensor data further includes generating simulated operating system events affecting an operation of the computer vision component based on simulated environmental changes over time.

In some examples, the simulated operating system events include a thermal throttling event, a network condition change event, an ambient noise event and a display adjustment event.

Other technical features may be readily apparent to one skilled in the art from the following figures, descriptions, and claims.

Computing Environment

FIG. 1 illustrates a content creation computing environment 100, in accordance with some examples. The content creation computing environment 100 comprises a content creation system 102 that simulates the operation of a head-wearable XR device 108 as a user wearing the head-wearable XR device 108 moves through a 3D environment 106 and interacts with an XR experience provided by an XR application executing on the head-wearable XR device 108. A content creator 104 interacts with a user interface 112 provided by the content creation system 102 to enter content creation platform configuration data 110 that configures various components of the content creation system 102 that simulate the operations of the head-wearable XR device 108 in order to determine power consumption and thermal conditions of the head-wearable XR device 108.

Machine Architecture

Figure 2:
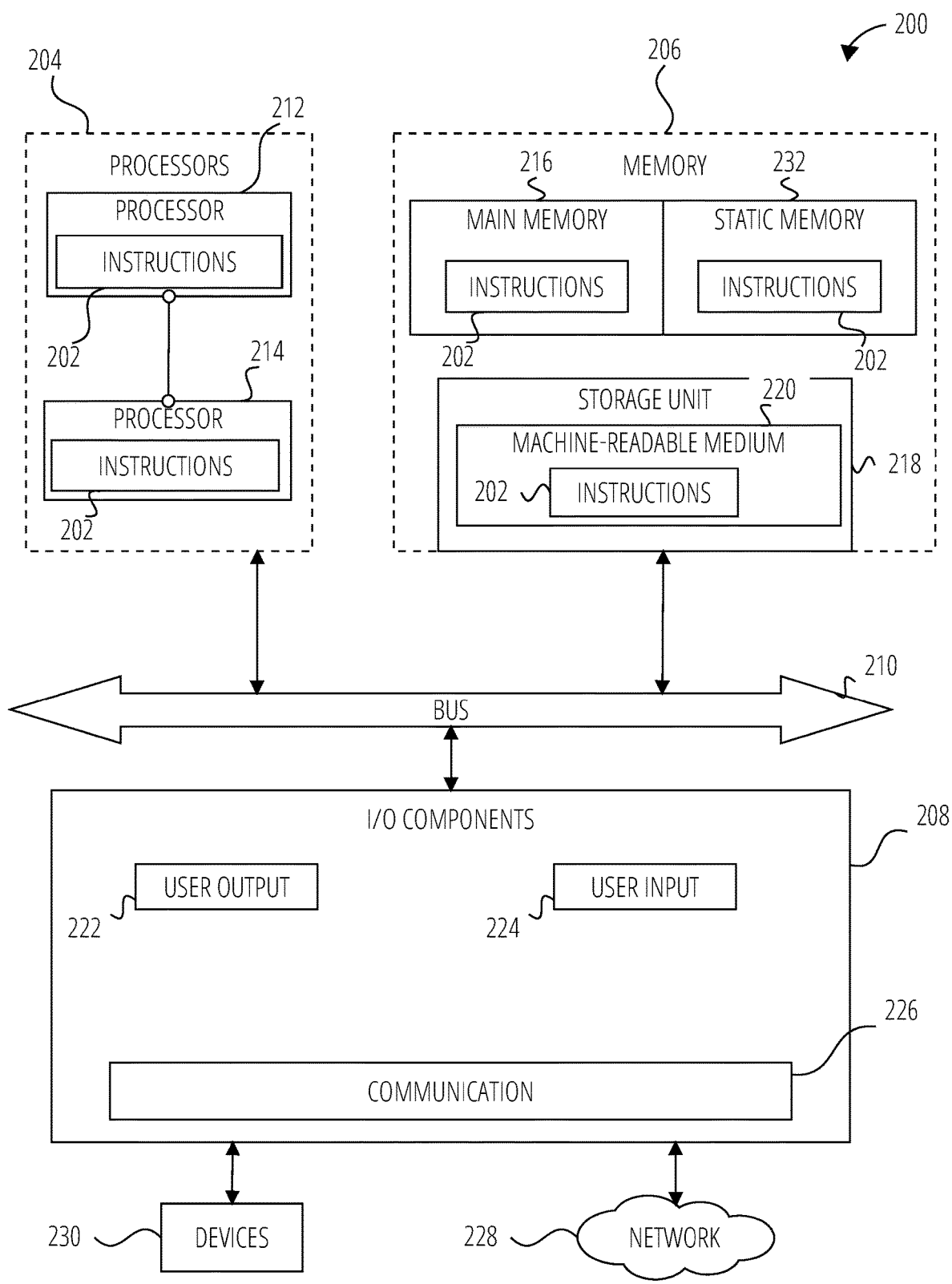
FIG. 2 is a diagrammatic representation of a machine in the form of a computer system within which a set of instructions may be executed to cause the machine to perform any one or more of the methodologies discussed herein, in accordance with some examples.

FIG. 2 is a diagrammatic representation of the machine 200 within which instructions 202 (e.g., software, a program, an application, an applet, an app, or other executable code) for causing the machine 200 to perform any one or more of the methodologies discussed herein may be executed. For example, the instructions 202 may cause the machine 200 to execute any one or more of the methods described herein. The instructions 202 transform the general, non-programmed machine 200 into a particular machine 200 programmed to carry out the described and illustrated functions in the manner described. The machine 200 may operate as a standalone device or may be coupled (e.g., networked) to other machines. In a networked deployment, the machine 200 may operate in the capacity of a server machine or a client machine in a server-client network environment, or as a peer machine in a peer-to-peer (or distributed) network environment. The machine 200 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 202, sequentially or otherwise, that specify actions to be taken by the machine 200. Further, while a single machine 200 is illustrated, the term "machine" shall also be taken to include a collection of machines that individually or jointly execute the instructions 202 to perform any one or more of the methodologies discussed herein. In some examples, the machine 200 may also comprise both client and server systems, with certain operations of a particular method or algorithm being performed on the server-side and with certain operations of the particular method or algorithm being performed on the client-side.

The machine 200 may include processors 204, memory 206, and input/output I/O components 208, which may be configured to communicate with each other via a bus 210. In an example, the processors 204 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 212 and a processor 214 that execute the instructions 202. The term "processor" is intended to include multi-core processors that may comprise two or more independent processors (sometimes referred to as "cores") that may execute instructions contemporaneously. Although FIG. 2 shows multiple processors 204, the machine 200 may include a single processor with a single-core, a single processor with multiple cores (e.g., a multi-core processor), multiple processors with a single core, multiple processors with multiples cores, or any combination thereof.

The memory 206 includes a main memory 216, a static memory 232, and a storage unit 218, both accessible to the processors 204 via the bus 210. The main memory 206, the static memory 232, and storage unit 218 store the instructions 202 embodying any one or more of the methodologies or functions described herein. The instructions 202 may also reside, completely or partially, within the main memory 216, within the static memory 232, within machine-readable medium 220 within the storage unit 218, within at least one of the processors 204 (e.g., within the processor's cache memory), or any suitable combination thereof, during execution thereof by the machine 200.

The I/O components 208 may include a wide variety of components to receive input, provide output, produce output, transmit information, exchange information, capture measurements, and so on. The specific I/O components 208 that are included in a particular machine will depend on the type of machine. For example, portable machines such as mobile phones may include a touch input device or other such input mechanisms, while a headless server machine will likely not include such a touch input device. It will be appreciated that the I/O components 208 may include many other components that are not shown in FIG. 2. In various examples, the I/O components 208 may include user output components 222 and user input components 224. The user output components 222 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 224 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 208 further include communication components 226 operable to couple the machine 200 to a network 228 or devices 230 via respective coupling or connections. For example, the communication components 226 may include a network interface component or another suitable device to interface with the network 228. In further examples, the communication components 226 may include wired communication components, wireless communication components, cellular communication components, Near Field Communication (NFC) components, Bluetooth® components (e.g., Bluetooth® Low Energy), Wi-FiR components, and other communication components to provide communication via other modalities. The devices 230 may be another machine or any of a wide variety of peripheral devices (e.g., a peripheral device coupled via a USB).

Moreover, the communication components 226 may detect identifiers or include components operable to detect identifiers. For example, the communication components 226 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 226, such as location via Internet Protocol (IP) geolocation, location via Wi-Fi® signal triangulation, location via detecting an NFC beacon signal that may indicate a particular location, and so forth.

The various memories (e.g., main memory 216, static memory 232, and memory of the processors 204) and storage unit 218 may store one or more sets of instructions and data structures (e.g., software) embodying or used by any one or more of the methodologies or functions described herein. These instructions (e.g., the instructions 202), when executed by processors 204, cause various operations to implement the disclosed examples.

The instructions 202 may be transmitted or received over the network 228, using a transmission medium, via a network interface device (e.g., a network interface component included in the communication components 226) and using any one of several well-known transfer protocols (e.g., hypertext transfer protocol (HTTP)). Similarly, the instructions 202 may be transmitted or received using a transmission medium via a coupling (e.g., a peer-to-peer coupling) to the devices 230.

System Operation

Figure 3A:
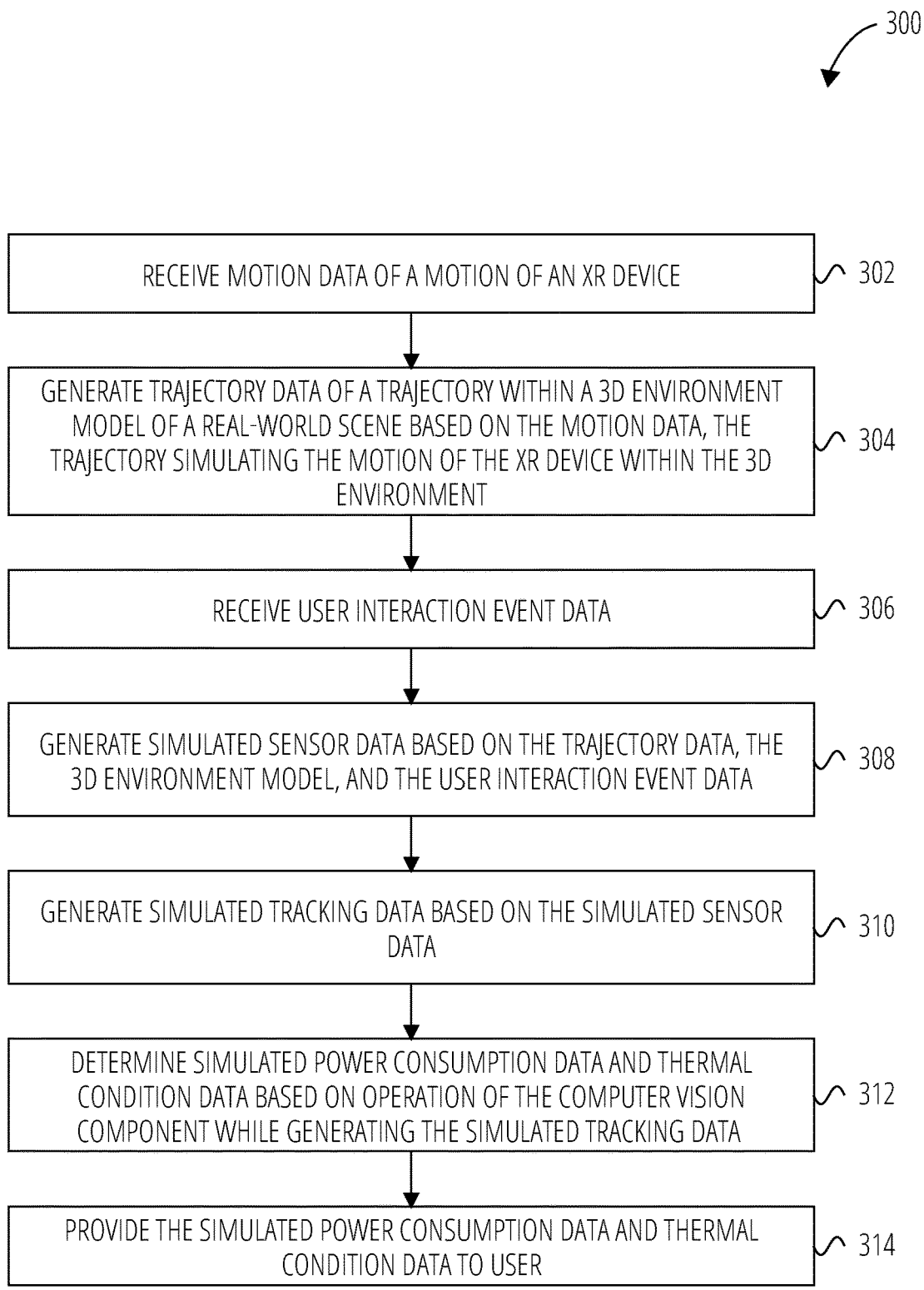
FIG. 3A is a process flow diagram of a content creation method, in accordance with some examples.
Figure 3B:
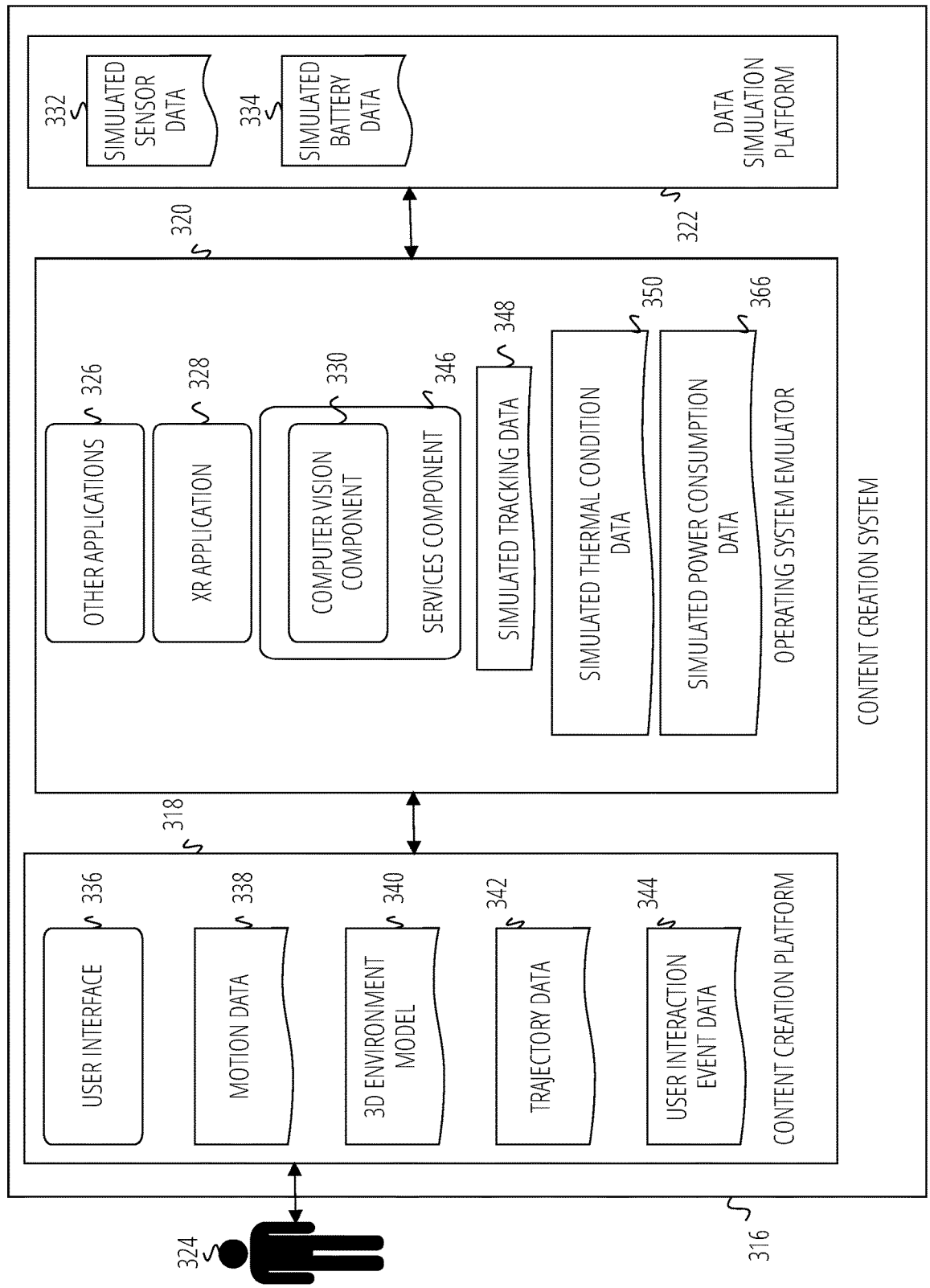
FIG. 3B is a diagram of a content creation system, in accordance with some examples.
Figure 3C:
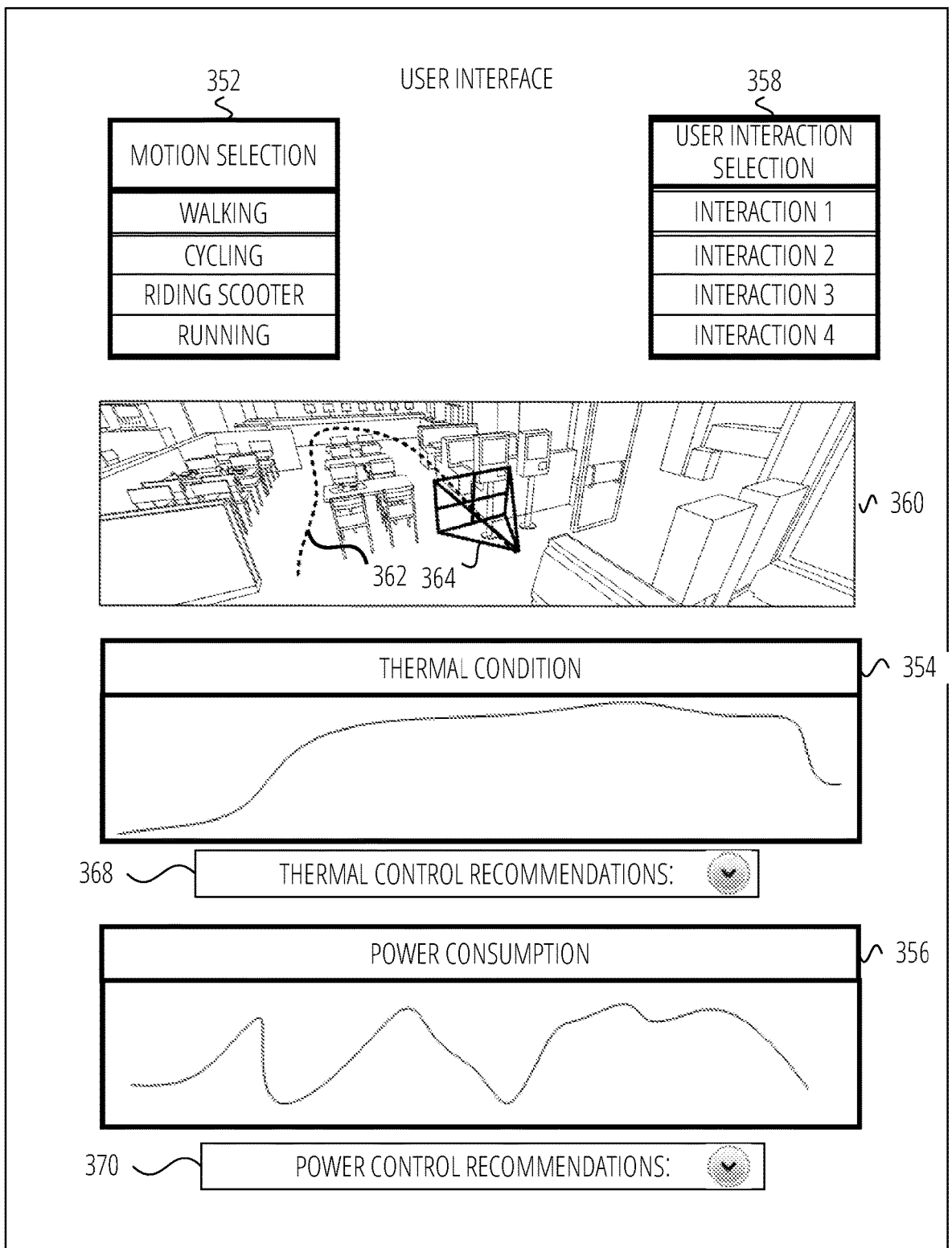
FIG. 3C illustrates a user interface for entering simulation parameters and displaying simulation results, in accordance with some examples.
Figure 3D:
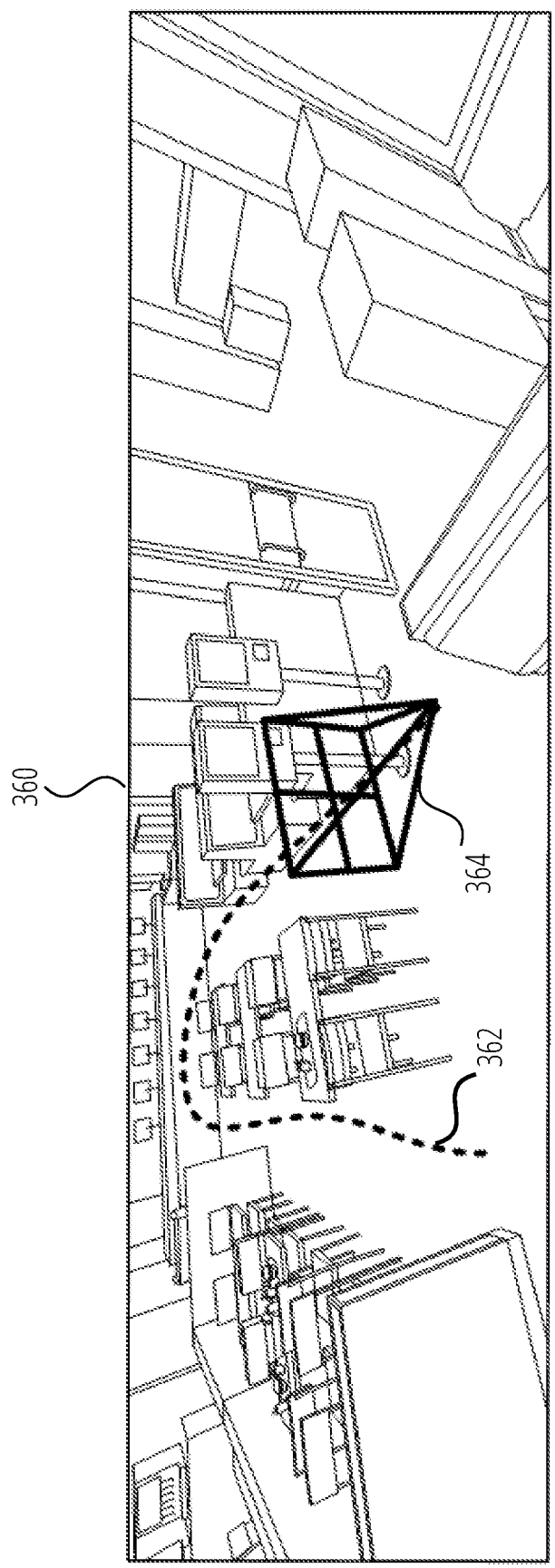
FIG. 3D illustrates a 3D environment, in accordance with some examples.
Figure 3E:
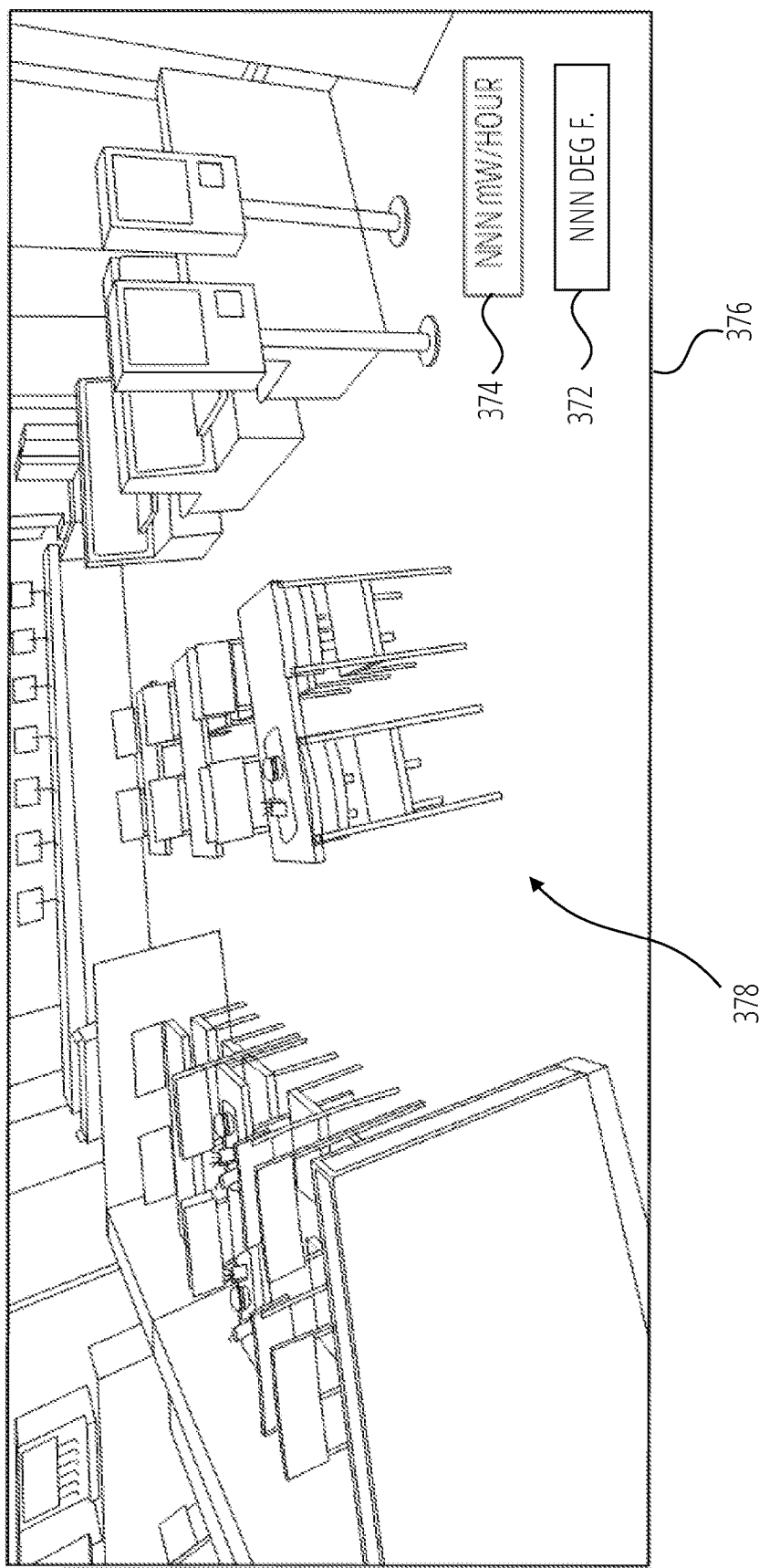
FIG. 3E illustrates a user interface for displaying simulation results, in accordance with some examples.

FIG. 3A is a process flow diagram of a content creation method 300, FIG. 3B is a diagram of a content creation system 316, FIG. 3C illustrates a user interface for entering simulation parameters and displaying simulation results, FIG. 3D illustrates a virtual 3D environment 360, and FIG. 3E illustrates a user interface for displaying simulation results, in accordance with some examples. in accordance with some examples. A content creator 324 uses the content creation system 316 to simulate operations of a head-wearable XR device worn by a user as the user interacts with an XR experience within a 3D environment represented by the virtual 3D environment 360.

In operation 302, a content creation platform 318 receives a selection of motion data 338 from a content creator 324 of one or more motions of a head-wearable XR device. The motion data 338 describes a path or trajectory of the head-wearable XR device while being worn by a user as the user interacts with an XR experience provided by the head-wearable XR device. The XR experience is provided to the user while the user moves through the 3D environment represented by the virtual 3D environment 360. For example, the motion can correspond to one or more movements or motions of the user such as, but not limited to, walking, jumping, riding a scooter, cycling, running, and the like.

In some examples, the motion data is motion data captured by a head-wearable XR device being worn by a user as the user makes the one or more motions. In some examples, the motion data is simulated motion data based on computed responses of a mathematical model of the head-wearable XR device subjected to a simulated motion. In some examples, the motion data is a synthesis of actual motion data captured by the head-wearable XR device and simulated motion data.

In some examples, the content creation platform 318 provides a user interface 336 including motion presets 352 to the content creator 324, and the content creator 324 uses the user interface 336 to select a preset motion of the motion data 338.

In operation 304, the content creation platform 318 generates trajectory data 342 of a trajectory 362 (of FIG. 3D) within the virtual 3D environment 360 represented by 3D environment model 340 based on the motion data and location data of a set of one or more locations in the 3D environment model 340. The trajectory 362 simulates the motion of the XR device within the 3D environment represented by the virtual 3D environment 360. For example, the content creation platform 318 uses a velocity component of the motion data and the location data to determine vector data of one or more vectors describing an instantaneous location, orientation or pose, and a field of view 364 (of FIG. 3D) of one or more cameras of the head-wearable XR device to determine where in the 3D environment model the head-wearable XR device would be at an instant of time. In some examples, the 3D environment model 340 includes one or more environmental regions having differing environmental conditions such as, but not limited to, an illumination, a level of ambient lighting, a temperature, a level of ambient acoustic noise, and the like.

In operation 306, content creation platform 318 receives user interaction event data 344. For example, the user interaction event data 344 includes one or more events related to a user interacting with the XR experience. The events include a timing indicator and/or a location indicator and one or more user interactions. The user interaction may be an interaction by the user with the XR experience that is detected through hand tracking or gesture recognition such as, but not limited to, a gesture being made by the user, an interaction with a virtual object of the XR experience, an interaction with a physical object represented in the 3D environment model 340, and the like. The user interactions represent simulated user interactions that can take place in the XR experience being provided by the XR application 328 but are not physically or actually taking place at the current time. They are selected by the XR application developer to represent a specific type of user interaction that can take place to view possible results and impacts.

In some examples, the content creator 104 is provided with a user interaction list 358 of possible user interactions by the user interface 336. The list of possible user interactions is based on a set of user interactions that are recognized by components of the services component 346 provided by the operating system emulator 320 such as, but not limited to, computer vision component 330. In some examples, the list of possible user interactions includes user interactions that are provided by the XR application. In some examples, the content creation platform 318 provides the user interface 336 to the content creator 324 and the content creator 324 uses the user interface 336 to select the user interactions and enter the timing indicators and/or location indicators of the user interaction event data. The timing indicators and location indicators represent travel times and locations of the XR device along a trajectory 362 of the XR device within a virtual 3D environment 360.

In operation 308, a data simulation platform generates simulated sensor data 332 and simulated battery data 334 based on the trajectory data, the 3D environment model, and the user interaction event data. For example, the data simulation platform 322 generates simulated first-person-view image data along the moving trajectory in the virtual 3D environment represented by the 3D environment model 340 based on a human model simulation of the user interactions of the user interaction event data 344, the 3D environment model 340, and the trajectory data 342. The simulated sensor data 332 is generated using the simulated first-person-view image data to generate simulated sensor data for a variety of sensors of a head-wearable XR device. The simulated sensor data 332 includes operational parameters and output data of the sensors of the head-wearable XR device as if the head-wearable XR device were being operated in the 3D environment as if user wearing the head-wearable XR device is moving through the 3D environment represented by the 3D environment model 340 along a trajectory represented by the trajectory data 342.

The simulated sensor data 332 can include output data and operational parameter data of one or more sensors of the head-wearable XR device such as, but not limited to, cameras, Inertial Motion Units (IMUs), Global Positioning System (GPS) sensors, and the like. The output data of the simulated sensor data 332 can include, but is not limited to, simulated image data, simulated orientation or pose data, simulated location data, and the like. The operational parameter data can include operational parameter data of one of the more sensors including, but not limited to, an auto-exposure setting or change, a camera frame rate or change, a number of cameras affected by the any changes or adjustments in response to a change in an environmental variable of the 3D environment model 340, automated changes in an IMU used to capture an orientation or pose of the head-wearable XR device, automated changes in a GPS sensor used to sense a location of a head-wearable XR device, operational mode of one or more lighting sources used by the head-wearable XR device, and the like.

In operation 310, a computer vision component 330 of a services component 346 of the operating system emulator 320 generates simulated tracking data 348 based on the simulated sensor data. For example, the computer vision component 330 uses simulated image data and simulated orientation or pose data of the simulated sensor data 332 to generate the simulated tracking data. The simulated tracking data includes the user interactions included in the user interaction event data 344. As the computer vision component 330 generates the simulated tracking data, the operating system emulator 320 uses simulated operating system events to impose simulated operational conditions on the computer vision component 330 as the computer vision component 330 generates the simulated tracking data. The simulated operating system events include, but are not limited to, a thermal throttling of a processor execution speed, a display change in a display being provided to a user during the XR experience, a brightness adjustment in an environmental region, a resolution change in an operational parameter of the computer vision component 330 or of one or more cameras of the head-wearable XR device, a refresh rate of the simulated sensor data 332, a low power mode imposed by the operating system emulator 320 affecting one or more services being provided by the services component 346, a network condition such as conditions for wireless communications, cellular telephony connections, GPS sensor communications, affects of ambient noise on one or more services provided by the 346, one or more affects on one or more services of the operating system emulator 320 caused by other applications 326, and the like.

In some examples, the computer vision component 330 generates the simulated tracking data 348 on the basis of categorizing the simulated sensor data 332 using artificial intelligence methodologies and a tracking model previously generated using machine learning methodologies. In some examples, a tracking model comprises, but is not limited to, a neural network, a learning vector quantization network, a logistic regression model, a support vector machine, a random decision forest, a naïve Bayes model, a linear discriminant analysis model, a K-nearest neighbor model, and the like. In some examples, machine learning methodologies may include, but are not limited to, supervised learning, unsupervised learning, semi-supervised learning, reinforcement learning, dimensionality reduction, self-learning, feature learning, sparse dictionary learning, anomaly detection, and the like.

In some examples, the computer vision component 330 extracts the simulated tracking data 348 from the simulated sensor data 332 using computer vision methodologies including, but not limited to, Harris corner detection, Shi-Tomasi corner detection, Scale-Invariant Feature Transform (SIFT), Speeded-Up Robust Features (SURF), Features from Accelerated Segment Test (FAST), Oriented FAST and Rotated BRIEF (ORB), and the like.

In operation 312, the operating system emulator 320 determines simulated thermal condition data 350 and simulated power consumption data 366 based on the operations of the computer vision component 330 as the computer vision component 330 generates the simulated tracking data 348. For example, the operating system emulator 320 determines a use of computing devices (e.g., processors, memory storage devices, Graphical Processing Units (GPUs), and the like) and sensors by the computer vision component 330 as the computer vision component 330 generates the simulated tracking data 348 and determines a simulated energy consumption for each of those devices. The operating system emulator 320 uses the energy consumption of the computing devices and sensors and calculates a thermal load on the head-wearable XR device and a consequent thermal condition such as a temperature of portions of the head-wearable XR device associated with the computing devices and sensors.

In operation 314, the content creation platform 318 provides to a user, such as the content creator 324, the simulated thermal condition data 350. For example, the content creation platform 318 uses the user interface 336 to provide the simulated thermal condition data 350 in a thermal condition display 354 and the simulated power consumption data 366 in a power consumption display 356 to the content creator 324. The content creator 324 uses the displayed simulated thermal condition data 350 and simulated power consumption data 366 to evaluate different settings or configurations of the components of the head-wearable XR device such as, but not limited to, the computer vision component 330. The simulated power consumption data can represent an aggregate of the power consumed by the XR application and/or can represent the individual power consumption resulting from any one or combination of the above described motions or interactions.

In some examples, the content creation platform 318 generates one or more thermal control recommendations and one or more power control recommendations based on the simulated thermal condition data 350 and the simulated power consumption data 366. The recommendations may be accessed by a thermal control recommendations 368 menu item and a power control recommendations 370 menu item of the user interface 336. For example, the content creation platform 318 can recommend timing adjustments to how quickly a simulated system should respond to a change in environmental conditions. In some examples, the content creation platform 318 can recommend changing parameters of a software component of the computer vision component 330 to affect power consumption.

In some examples, the content creation platform 318 generates a user perspective user interface 376 to provide the simulated thermal condition data 350 and the simulated power consumption data 366 to a content creator 324. For example, the user perspective user interface 376 comprises one or more power usage meters 374 and one or more thermal condition meters 372. The user perspective user interface 376 also comprises a synchronized view 378 of the virtual 3D environment 360 from a perspective of a user wearing a head-wearable XR device 108 as if moving along the trajectory 362 through the virtual 3D environment 360 and viewing the virtual 3D environment 360 within the field of view 364 specified in the trajectory data 342. Values displayed in the one or more thermal condition meters 372 and the one or more power usage meters 374 correspond with the simulated operations of the head-wearable XR device 108 as the head-wearable XR device 108 is virtually moved along the trajectory 362 and virtually responding to the user interaction event data 344.

Software Architecture

Figure 4:
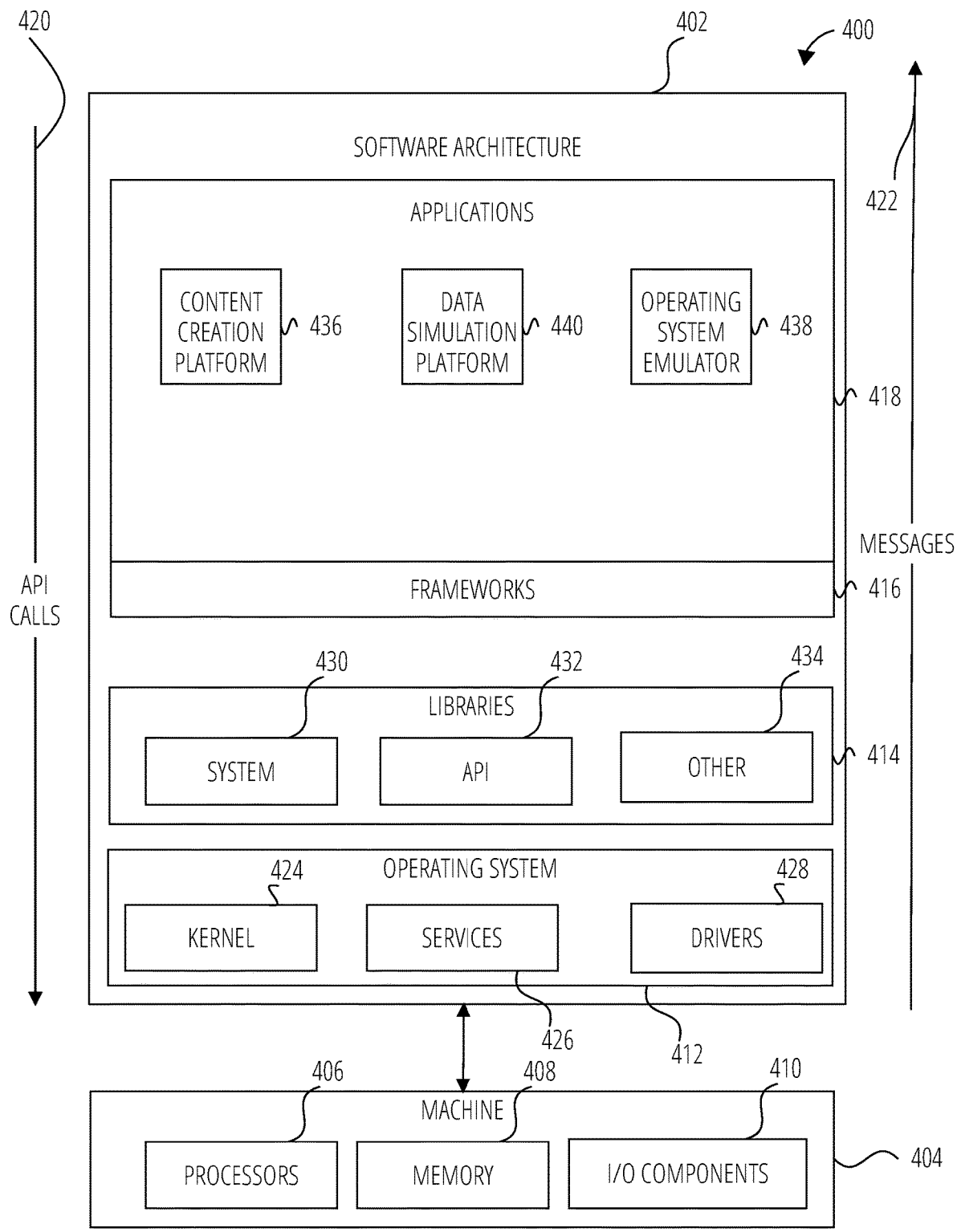
FIG. 4 is a block diagram showing a software architecture, in accordance with some examples.

FIG. 4 is a block diagram 400 illustrating a software architecture 402, which can be installed on any one or more of the devices described herein. The software architecture 402 is supported by hardware such as a machine 404 that includes processors 406, memory 408, and I/O components 410. In this example, the software architecture 402 can be conceptualized as a stack of layers, where each layer provides a particular functionality. The software architecture 402 includes layers such as an operating system 412, libraries 414, frameworks 416, and applications 418. Operationally, the applications 418 invoke API calls 420 through the software stack and receive messages 422 in response to the API calls 420.

The operating system 412 manages hardware resources and provides common services. The operating system 412 includes, for example, a kernel 424, services 426, and drivers 428. The kernel 424 acts as an abstraction layer between the hardware and the other software layers. For example, the kernel 424 provides memory management, processor management (e.g., scheduling), component management, networking, and security settings, among other functionalities. The services 426 can provide other common services for the other software layers. The drivers 428 are responsible for controlling or interfacing with the underlying hardware. For instance, the drivers 428 can include display drivers, camera drivers, BLUETOOTH® or BLUETOOTH® Low Energy drivers, flash memory drivers, serial communication drivers (e.g., USB drivers), WI-FI® drivers, audio drivers, power management drivers, and so forth.

The libraries 414 provide a common low-level infrastructure used by the applications 418. The libraries 414 can include system libraries 430 (e.g., C standard library) that provide functions such as memory allocation functions, string manipulation functions, mathematic functions, and the like. In addition, the libraries 414 can include API libraries 432 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 414 can also include a wide variety of other libraries 434 to provide many other APIs to the applications 418.

The frameworks 416 provide a common high-level infrastructure that is used by the applications 418. For example, the frameworks 416 provide various graphical user interface (GUI) functions, high-level resource management, and high-level location services. The frameworks 416 can provide a broad spectrum of other APIs that can be used by the applications 418, some of which may be specific to a particular operating system or platform.

In some examples, the applications 418 include a content creation platform 436, a data simulation platform 440, an operating system emulator 438, and a broad assortment of other applications such as a third-party applications. The applications 418 are programs that execute functions defined in the programs. Various programming languages can be employed to create one or more of the applications 418, structured in a variety of manners, such as object-oriented programming languages (e.g., Objective-C, Java, or C++) or procedural programming languages (e.g., C or assembly language).

Figure 5A:
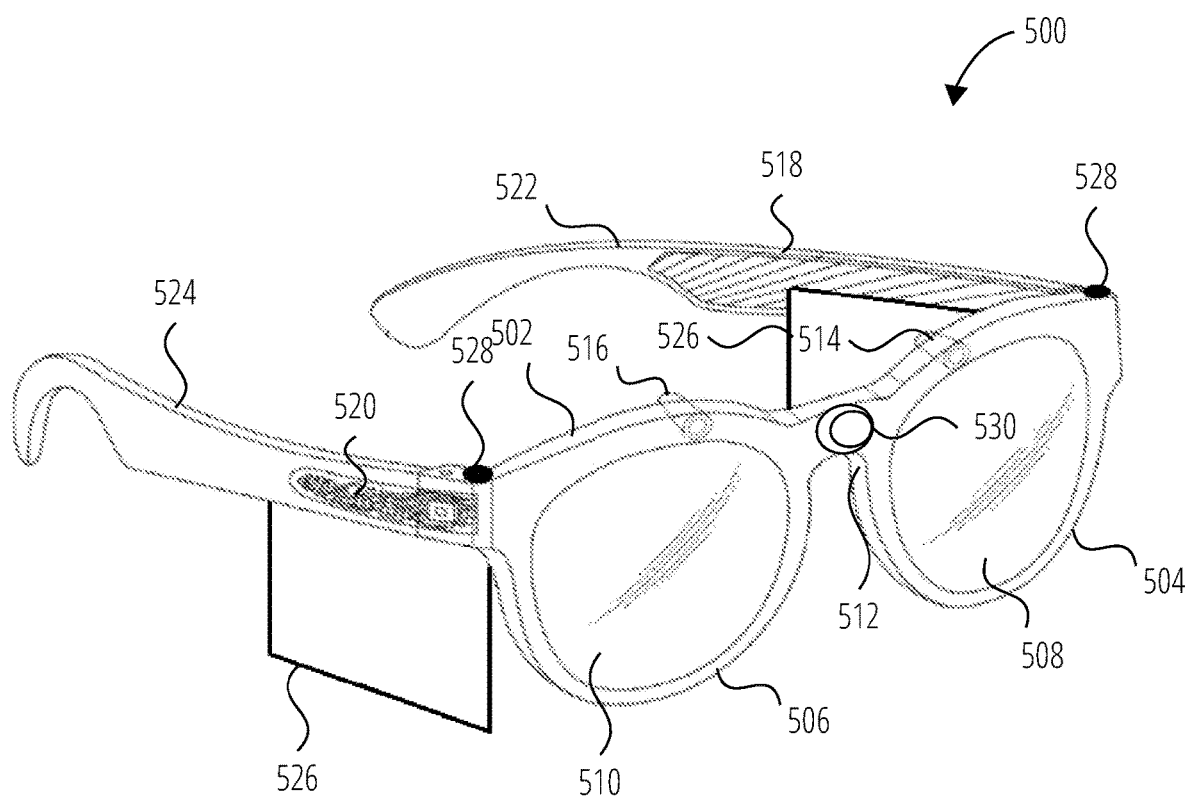
FIG. 5A is a perspective front view of a head-wearable XR device and FIG. 5B is a view of the head-wearable XR device from a perspective of a user, in accordance with some examples.

FIG. 5A is a perspective view of a head-wearable XR device of an XR system, in accordance with some examples. A head-wearable XR device (e.g., glasses 500 of FIG. 5A), include a frame 502 made from any suitable material such as plastic or metal, including any suitable shape memory alloy. In one or more examples, the frame 502 includes a first or left optical element holder 504 (e.g., a display or lens holder) and a second or right optical element holder 506 connected by a bridge 512. A first or left optical element 508 and a second or right optical element 510 can be provided within respective left optical element holder 504 and right optical element holder 506. The right optical element 510 and the left optical element 508 can be a lens, a display, a display assembly, or a combination of the foregoing. Any suitable display assembly can be provided in the glasses 500.

The frame 502 additionally includes a left arm or right temple piece 522 and a right arm or left temple piece 524. In some examples the frame 502 can be formed from a single piece of material so as to have a unitary or integral construction.

The glasses 500 can include a computing system, such as a machine 520, which can be of any suitable type so as to be carried by the frame 502 and, in one or more examples, of a suitable size and shape, so as to be partially disposed in one of the right temple piece 522 or the left temple piece 524. The machine 520 can include multiple processors, memory, and various communication components sharing a common power source. As discussed below, various components of the machine 520 may comprise low-power circuitry, high-speed circuitry, and a display processor. Various other examples may include these elements in different configurations or integrated together in different ways. Additional details of aspects of the machine 520 may be implemented as illustrated by the machine 600 discussed below.

The machine 520 additionally includes a battery 518 or other suitable portable power supply. In some examples, the battery 518 is disposed in left right temple piece 522 and is electrically coupled to the machine 520 disposed in the right left temple piece 524. The glasses 500 can include a connector or port (not shown) suitable for charging the battery 518, a wireless receiver, transmitter or transceiver (not shown), or a combination of such devices.

The glasses 500 include a first or left camera 514 and a second or right camera 516. Although two cameras are depicted, other examples contemplate the use of a single or additional (i.e., more than two) cameras. In one or more examples, the glasses 500 include any number of input sensors or other input/output devices in addition to the left camera 514 and the right camera 516. Such sensors or input/output devices can additionally include biometric sensors, location sensors, motion sensors, and so forth.

In some examples, the left camera 514 and the right camera 516 provide video frame data for use by the glasses 500 to extract 3D information from a real-world scene environment scene.

The glasses 500 may also include a touchpad 526 mounted to or integrated with one or both of the left right temple piece 522 and right left temple piece 524. The touchpad 526 is generally vertically arranged, approximately parallel to a user's temple in some examples. As used herein, generally vertically aligned means that the touchpad is more vertical than horizontal, although potentially more vertical than that. Additional user input may be provided by one or more buttons 528, which in the illustrated examples are provided on the outer upper edges of the left optical element holder 504 and right optical element holder 506. The one or more touchpads 526 and buttons 528 provide a means whereby the glasses 500 can receive input from a user of the glasses 500.

In some examples, the glasses 500 have a projector 530 mounted in a forward-facing location on the frame 502 of the glasses 500. The projector may be used by an adaptive 3D sensing system of the glasses 500 to project a focused beam of light enabling the adaptive 3D sensing system to perform adaptive 3D sensing.

Figure 5B:
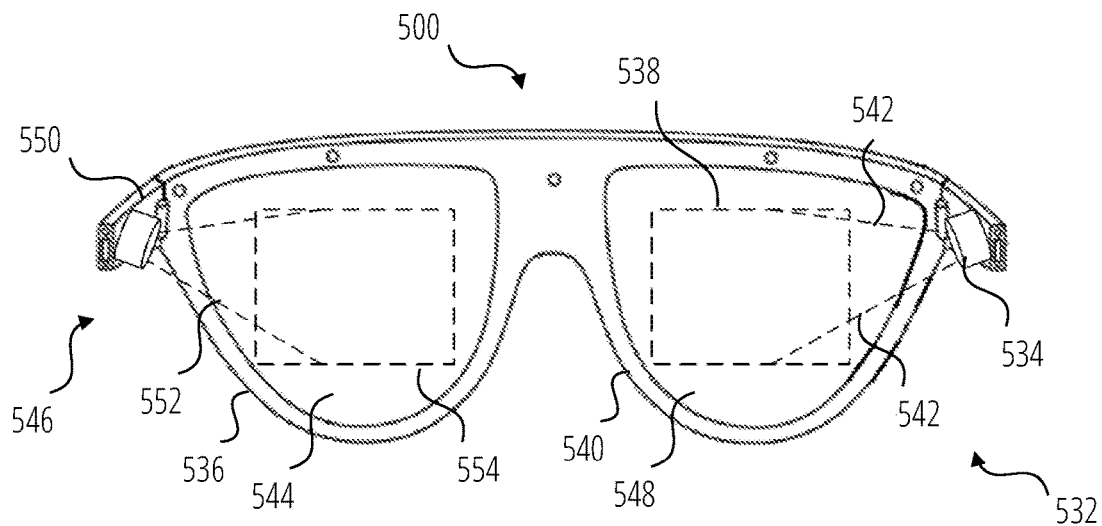

FIG. 5B illustrates the glasses 500 from the perspective of a user. For clarity, a number of the elements shown in FIG. 5A have been omitted. As described in FIG. 5A, the glasses 500 shown in FIG. 5B include left optical element 544 and right optical element 548 secured within the left optical element holder 536 and the right optical element holder 540 respectively.

The glasses 500 include forward optical assembly 532 comprising a right projector 534 and a right near eye display 538, and a forward optical assembly 546 including a left projector 550 and a left near eye display 554.

In some examples, the near eye displays are waveguides. The waveguides include reflective or diffractive structures (e.g., gratings and/or optical elements such as mirrors, lenses, or prisms). Light 542 emitted by the projector 534 encounters the diffractive structures of the waveguide of the near eye display 538, which directs the light towards the right eye of a user to provide an image on or in the right optical element 548 that overlays the view of the real-world scene environment seen by the user. Similarly, light 552 emitted by the projector 550 encounters the diffractive structures of the waveguide of the near eye display 554, which directs the light towards the left eye of a user to provide an image on or in the left optical element 544 that overlays the view of the real-world scene environment seen by the user. The combination of a GPU, the forward optical assembly 532, the left optical element 544, and the right optical element 548 provide an optical engine of the glasses 500. The glasses 500 use the optical engine to generate an overlay of the real-world scene environment view of the user including display of a user interface to the user of the glasses 500.

It will be appreciated however that other display technologies or configurations may be utilized within an optical engine to display an image to a user in the user's field of view. For example, instead of a projector 534 and a waveguide, an LCD, LED or other display panel or surface may be provided.

In use, a user of the glasses 500 can be presented with information, content and various user interfaces on the near eye displays. As described in more detail herein, the user can then interact with the glasses 500 using a touchpad 526 and/or button 528, voice inputs or touch inputs on an associated device (e.g. a mobile computing system), and/or hand movements, locations, and positions detected by the glasses 500.

In some examples, the glasses 500 comprise a stand-alone XR system that provides an XR experience to a user of the glasses 500. In some examples, the glasses 500 are a component of an XR system that includes one or more other devices providing additional computational resources and or additional user input and output resources. The other devices may comprise a smartphone, a general purpose computer, or the like.

Machine Architecture

Figure 6:
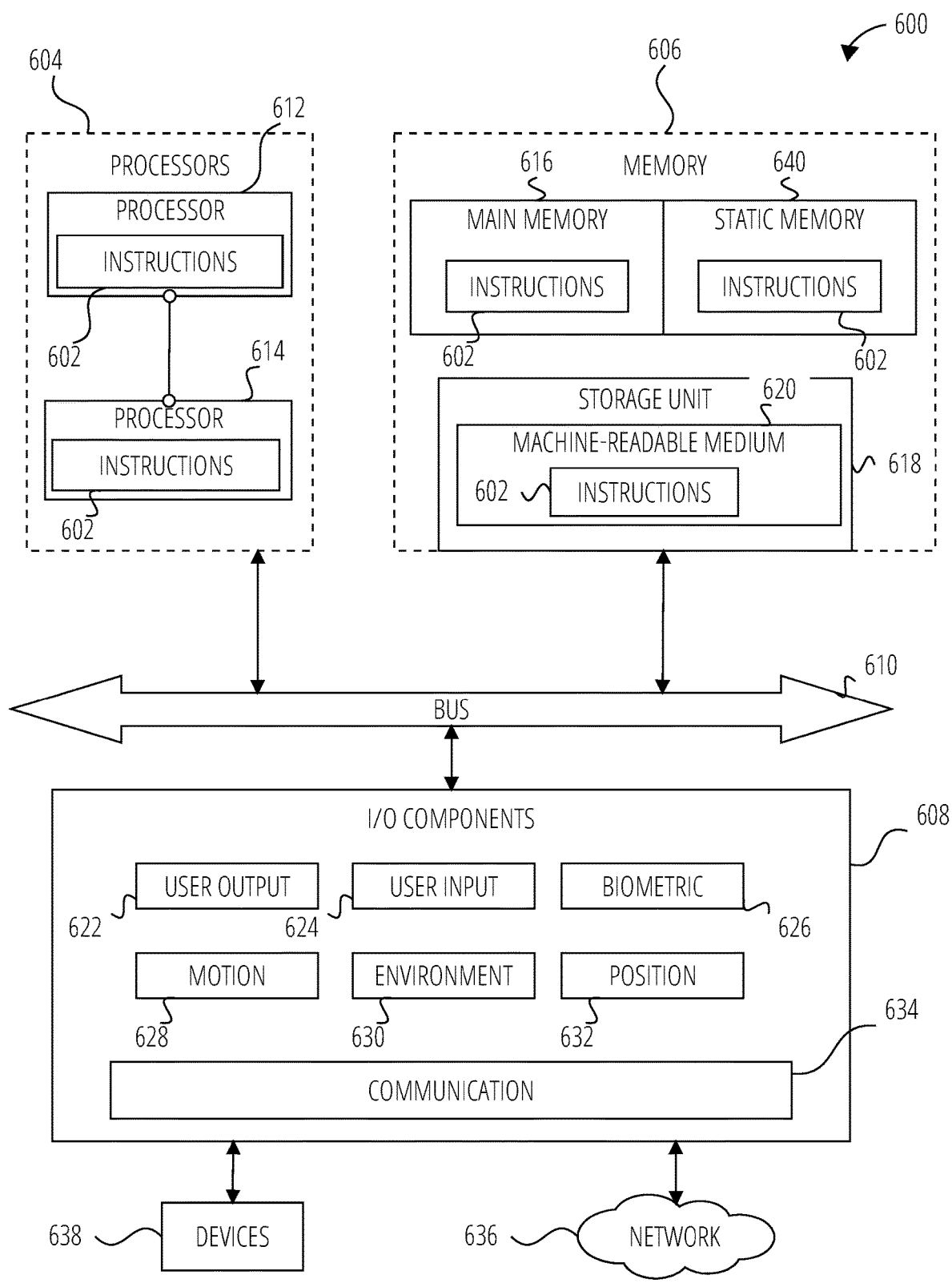
FIG. 6 is a diagrammatic representation of another machine in the form of a computer system within which a set of instructions may be executed to cause the machine to perform any one or more of the methodologies discussed herein, in accordance with some examples.

FIG. 6 is a diagrammatic representation of the machine 600 within which instructions 602 (e.g., software, a program, an application, an applet, an app, or other executable code) for causing the machine 600 to perform any one or more of the methodologies discussed herein may be executed. For example, the instructions 602 may cause the machine 600 to execute any one or more of the methods described herein. The instructions 602 transform the general, non-programmed machine 600 into a particular machine 600 programmed to carry out the described and illustrated functions in the manner described. The machine 600 may operate as a standalone device or may be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 602, sequentially or otherwise, that specify actions to be taken by the machine 600. Further, while a single machine 600 is illustrated, the term "machine" shall also be taken to include a collection of machines that individually or jointly execute the instructions 602 to perform any one or more of the methodologies discussed herein. In some examples, the machine 600 may also comprise both client and server systems, with certain operations of a particular method or algorithm being performed on the server-side and with certain operations of the particular method or algorithm being performed on the client-side.

The machine 600 may include processors 604, memory 606, and input/output I/O components 608, which may be configured to communicate with each other via a bus 610. In an example, the processors 604 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 612 and a processor 614 that execute the instructions 602. The term "processor" is intended to include multi-core processors that may comprise two or more independent processors (sometimes referred to as "cores") that may execute instructions contemporaneously. Although FIG. 6 shows multiple processors 604, the machine 600 may include a single processor with a single-core, a single processor with multiple cores (e.g., a multi-core processor), multiple processors with a single core, multiple processors with multiples cores, or any combination thereof.

The memory 606 includes a main memory 616, a static memory 640, and a storage unit 618, both accessible to the processors 604 via the bus 610. The main memory 606, the static memory 640, and storage unit 618 store the instructions 602 embodying any one or more of the methodologies or functions described herein. The instructions 602 may also reside, completely or partially, within the main memory 616, within the static memory 640, within machine-readable medium 620 within the storage unit 618, within at least one of the processors 604 (e.g., within the processor's cache memory), or any suitable combination thereof, during execution thereof by the machine 600.

The I/O components 608 may include a wide variety of components to receive input, provide output, produce output, transmit information, exchange information, capture measurements, and so on. The specific I/O components 608 that are included in a particular machine will depend on the type of machine. For example, portable machines such as mobile phones may include a touch input device or other such input mechanisms, while a headless server machine will likely not include such a touch input device. It will be appreciated that the I/O components 608 may include many other components that are not shown in FIG. 6. In various examples, the I/O components 608 may include user output components 622 and user input components 624. The user output components 622 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 624 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

In further examples, the I/O components 608 may include biometric components 626, motion components 628, environmental components 630, or position components 632, among a wide array of other components. For example, the biometric components 626 include components to detect expressions (e.g., hand expressions, facial expressions, vocal expressions, body gestures, or eye-tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 628 include acceleration sensor components (e.g., accelerometer), gravitation sensor components, rotation sensor components (e.g., gyroscope).

The environmental components 630 include, for example, one or cameras (with still image/photograph and video capabilities), illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), depth or distance sensors (e.g., sensors to determine a distance to an object or a depth in a 3D coordinate system of features of an object), or other components that may provide indications, measurements, or signals corresponding to a surrounding physical environment.

The position components 632 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 608 further include communication components 634 operable to couple the machine 600 to a network 636 or devices 638 via respective coupling or connections. For example, the communication components 634 may include a network interface component or another suitable device to interface with the network 636. In further examples, the communication components 634 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 638 may be another machine or any of a wide variety of peripheral devices (e.g., a peripheral device coupled via a USB).

Moreover, the communication components 634 may detect identifiers or include components operable to detect identifiers. For example, the communication components 634 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 634, such as location via Internet Protocol (IP) geolocation, location via Wi-Fi® signal triangulation, location via detecting an NFC beacon signal that may indicate a particular location, and so forth.

The various memories (e.g., main memory 616, static memory 640, and memory of the processors 604) and storage unit 618 may store one or more sets of instructions and data structures (e.g., software) embodying or used by any one or more of the methodologies or functions described herein. These instructions (e.g., the instructions 602), when executed by processors 604, cause various operations to implement the disclosed examples.

The instructions 602 may be transmitted or received over the network 636, using a transmission medium, via a network interface device (e.g., a network interface component included in the communication components 634) and using any one of several well-known transfer protocols (e.g., hypertext transfer protocol (HTTP)). Similarly, the instructions 602 may be transmitted or received using a transmission medium via a coupling (e.g., a peer-to-peer coupling) to the devices 638.

Software Architecture

Figure 7:
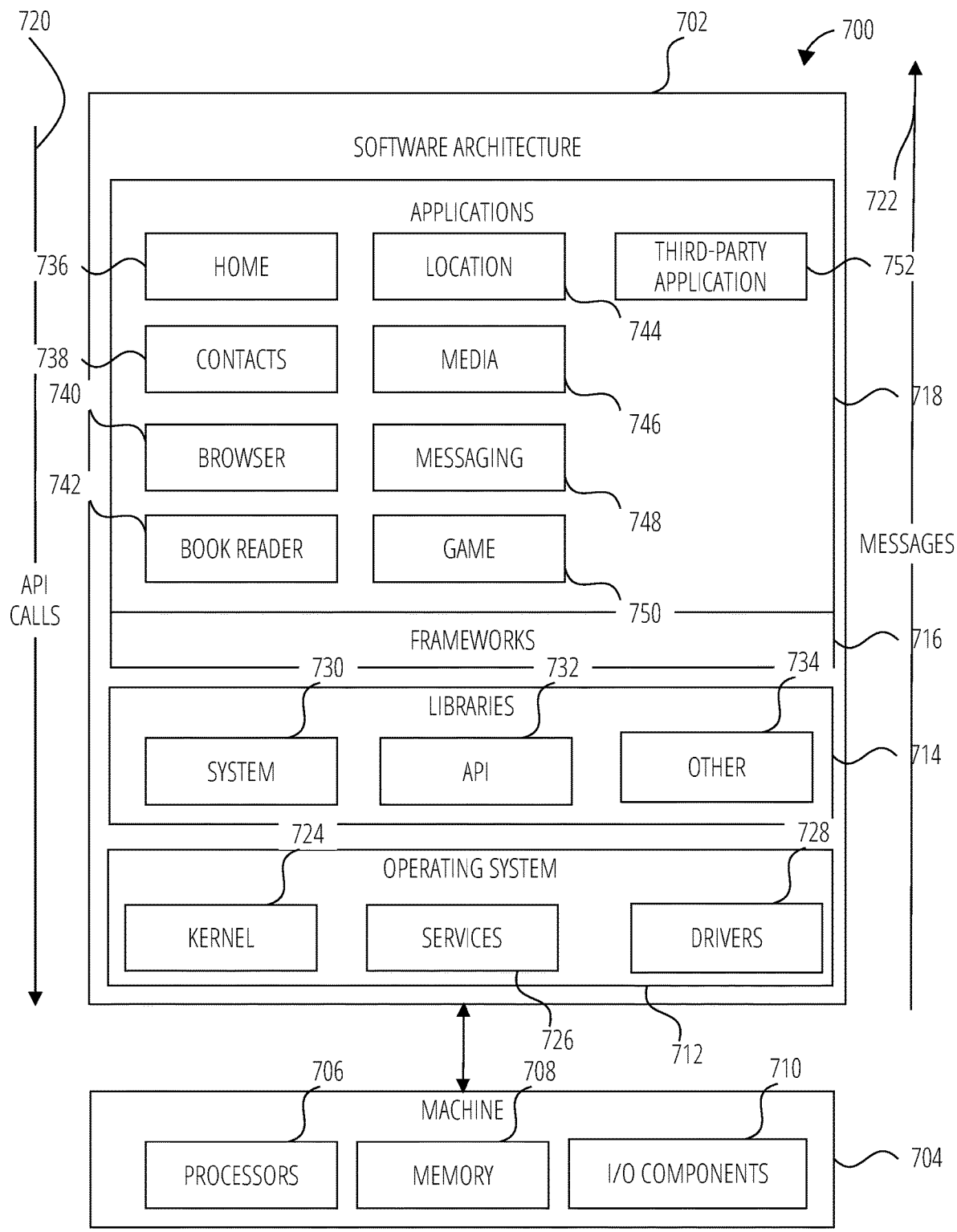
FIG. 7 is a block diagram showing another software architecture, in accordance with some examples.

FIG. 7 is a software architecture 700 illustrating a software architecture 702, which can be installed on any one or more of the devices described herein. The software architecture 702 is supported by hardware such as a machine 704 that includes processors 706, memory 708, and I/O components 710. In this example, the software architecture 702 can be conceptualized as a stack of layers, where each layer provides a particular functionality. The software architecture 702 includes layers such as an operating system 712, libraries 714, frameworks 716, and applications 718. Operationally, the applications 718 invoke API calls 720 through the software stack and receive messages 722 in response to the API calls 720.

The operating system 712 manages hardware resources and provides common services. The operating system 712 includes, for example, a kernel 724, services 726, and drivers 728. The kernel 724 acts as an abstraction layer between the hardware and the other software layers. For example, the kernel 724 provides memory management, processor management (e.g., scheduling), component management, networking, and security settings, among other functionalities. The services 726 can provide other common services for the other software layers. The drivers 728 are responsible for controlling or interfacing with the underlying hardware. For instance, the drivers 728 can include display drivers, camera drivers, BLUETOOTH® or BLUETOOTH® Low Energy drivers, flash memory drivers, serial communication drivers (e.g., USB drivers), WI-FI® drivers, audio drivers, power management drivers, and so forth.

The libraries 714 provide a common low-level infrastructure used by the applications 718. The libraries 714 can include system libraries 730 (e.g., C standard library) that provide functions such as memory allocation functions, string manipulation functions, mathematic functions, and the like. In addition, the libraries 714 can include API libraries 732 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 714 can also include a wide variety of other libraries 734 to provide many other APIs to the applications 718.

The frameworks 716 provide a common high-level infrastructure that is used by the applications 718. For example, the frameworks 716 provide various graphical user interface (GUI) functions, high-level resource management, and high-level location services. The frameworks 716 can provide a broad spectrum of other APIs that can be used by the applications 718, some of which may be specific to a particular operating system or platform.

In an example, the applications 718 may include a home application 736, a contacts application 738, a browser application 740, a book reader application 742, a location application 744, a media application 746, a messaging application 748, a game application 750, and a broad assortment of other applications such as a third-party application 752. The applications 718 are programs that execute functions defined in the programs. Various programming languages can be employed to create one or more of the applications 718, structured in a variety of manners, such as object-oriented programming languages (e.g., Objective-C, Java, or C++) or procedural programming languages (e.g., C or assembly language). In a specific example, the third-party application 752 (e.g., an application developed using the ANDROID™ or IOS™ software development kit (SDK) by an entity other than the vendor of the particular platform) may be mobile software running on a mobile operating system such as IOS™, ANDROID™, WINDOWS® Phone, or another mobile operating system. In this example, the third-party application 752 can invoke the API calls 720 provided by the operating system 712 to facilitate functionalities described herein.

CONCLUSION

Changes and modifications may be made to the disclosed examples without departing from the scope of the present disclosure. These and other changes or modifications are intended to be included within the scope of the present disclosure, as expressed in the following claims.

Glossary

"Carrier signal" refers to any intangible medium that is capable of storing, encoding, or carrying instructions for execution by the machine and includes digital or analog communications signals or other intangible media to facilitate communication of such instructions. Instructions may be transmitted or received over a network using a transmission medium via a network interface device.

"Communication network" refers to one or more portions of a network that may be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network or a portion of a network may include a wireless or cellular network, and the coupling may be a Code Division Multiple Access (CDMA) connection, a Global System for Mobile communications (GSM) connection, or other types of cellular or wireless coupling. In this example, the coupling may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth-generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long-range protocols, or other data transfer technology.

"Component" refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Machine-readable storage medium" refers to both machine-storage media and transmission media. Thus, the terms include both storage devices/media and carrier waves/modulated data signals. The terms "computer-readable medium," "machine-readable medium" and "device-readable medium" mean the same thing and may be used interchangeably in this disclosure.

"Non-transitory machine-readable storage medium" refers to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Signal medium" refers to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

Changes and modifications may be made to the disclosed examples without departing from the scope of the present disclosure. These and other changes or modifications are intended to be included within the scope of the present disclosure, as expressed in the following claims.

What is claimed is:

1. A computer-implemented method comprising:
    receiving, by a content creation platform, motion data of motion of an XR device;
    generating, by the content creation platform, trajectory data of a trajectory of the XR device within a 3D environment model of a 3D environment based on the motion data, the data of the trajectory simulating the motion of the XR device within the 3D environment;
    receiving, by the content creation platform, user interaction event data;
    generating, by a data simulation platform, simulated sensor data based on the data of the trajectory of the XR device, the 3D environment model, and the user interaction event data, the simulated sensor data including simulated image data and simulated pose data of one or more sensors of the XR device;
    generating, by a computer vision component within an operating system emulator, simulated tracking data of the trajectory simulating the motion of the XR device within the 3D environment using the simulated sensor data, one or more simulated operational conditions, and computer vision methodologies selected from the group consisting of Harris corner detection, Shi-Tomasi corner detection, Scale-Invariant Feature Transform (SIFT), Speeded-Up Robust Features (SURF), Features from Accelerated Segment Test (FAST), and Oriented FAST and Rotated BRIEF (ORB);
    determining, by an operating system emulator, simulated energy consumption data of one or more computing devices of the computer vision component and the one or more sensors of the XR device based on operation of the computer vision component while generating the simulated tracking data; and
    determining, by the operating system emulator using the energy consumption data, simulated thermal condition data including a thermal load and a consequent thermal condition including temperatures of portions of the XR device associated with the one or more computing devices and the one or more sensors; and
    providing, by the content creation platform to a user, the simulated energy consumption data and the simulated thermal condition data of the XR device.

2. The computer-implemented method of claim 1, wherein receiving the motion data of the XR device comprises:
    capturing the data of the motion of the XR device as the XR device is moved through a real-world scene by a user.

3. The computer-implemented method of claim 1, wherein receiving the motion data of the XR device comprises:
    selecting the data of the motion from a listing of stored data.

4. The computer-implemented method of claim 1, wherein the user interaction event is associated with a time event.

5. The computer-implemented method of claim 1, wherein the user interaction event is associated with a location within the the 3D environment.

6. The computer-implemented method of claim 1, wherein the user interaction event is a gesture made by a user.

7. The computer-implemented method of claim 1, wherein generating the trajectory data of the trajectory within the 3D environment model further comprises:
   changing an illumination parameter of the 3D environment model.

8. The computer-implemented method of claim 1, wherein the simulated sensor data includes camera data, Inertial Motion Unit data, and Global Positioning Sensor data.

9. The computer-implemented method of claim 1, wherein the simulated tracking data includes device pose data and hand recognition result data.

10. The computer-implemented method of claim 1, wherein generating, by the computer vision component within the operating system emulator, simulated tracking data further comprises:
   generating, by the operating system emulator, simulated operating system events affecting an operation of the computer vision component based on simulated environmental changes over time.

11. The computer-implemented method of claim 10, wherein the simulated operating system events include a thermal throttling event, a network condition change event, an ambient noise event and a display adjustment event.

12. A machine comprising:
   one or more processors; and
   a memory storing instructions that, when executed by the one or more processors, cause the machine to perform operations comprising:
   receiving, by a content creation platform, motion data of motion of an XR device;
   generating, by the content creation platform, trajectory data of a trajectory of the XR device within a 3D environment model of a 3D environment based on the motion data, the data of the trajectory simulating the motion of the XR device within the 3D environment;
   receiving, by the content creation platform, user interaction event data;
   generating, by a data simulation platform, simulated sensor data based on the data of the trajectory of the XR device, the 3D environment model, and the user interaction event data, the simulated sensor data including simulated image data and simulated pose data of one or more sensors of the XR device;
   generating, by a computer vision component within an operating system emulator, simulated tracking data of the trajectory simulating the motion of the XR device within the 3D environment using the simulated sensor data, one or more simulated operational conditions, and computer vision methodologies selected from the group consisting of Harris corner detection, Shi-Tomasi corner detection, Scale-Invariant Feature Transform (SIFT), Speeded-Up Robust Features (SURF), Features from Accelerated Segment Test (FAST), and Oriented FAST and Rotated BRIEF (ORB);
   determining, by an operating system emulator, simulated energy consumption data of one or more computing devices of the computer vision component and the one or more sensors of the XR device based on operation of the computer vision component while generating the simulated tracking data; and
   determining by the operating system emulator using the energy consumption data, simulated thermal condition data including a thermal load and a consequent thermal condition including temperatures of portions of the XR device associated with the one or more computing devices and the one or more sensors; and
   providing, by the content creation platform to a user, the simulated energy consumption data and the simulated thermal condition data of the XR device.

13. The machine of claim 12, wherein receiving data of the motion of the XR device comprises:
   capturing the data of the motion of the XR device as the XR device is moved through a real-world scene by a user.

14. The machine of claim 12, wherein receiving data of the motion of the XR device comprises:
   selecting the data of the motion from a listing of stored data.

15. The machine of claim 12, wherein the user interaction event is associated with a time event.

16. The machine of claim 12, wherein the user interaction event is associated with a location within the the 3D environment.

17. The machine of claim 12, wherein the user interaction event is a gesture made by a user.

18. The machine of claim 12, wherein generating the trajectory data of the trajectory within the 3D environment model further comprises:
   changing an illumination parameter of the 3D environment model.

19. The machine of claim 12, wherein the simulated sensor data includes camera data, Inertial Motion Unit data, and Global Positioning Sensor data.

20. A non-transitory machine-readable storage medium, the machine-readable storage medium including instructions that when executed by a computer, cause the computer to perform operations comprising:
   receiving, by a content creation platform, motion data of motion of an XR device;
   generating, by the content creation platform, trajectory data of a trajectory of the XR device within a 3D environment model of a 3D environment based on the motion data, the data of the trajectory simulating the motion of the XR device within the 3D environment;
   receiving, by the content creation platform, user interaction event data;
   generating, by a data simulation platform, simulated sensor data based on the data of the trajectory of the XR device, the 3D environment model, and the user interaction event data, the simulated sensor data including simulated image data and simulated pose data of one or more sensors of the XR device;
   generating, by a computer vision component within an operating system emulator, simulated tracking data of the trajectory simulating the motion of the XR device within the 3D environment using the simulated sensor data, one or more simulated operational conditions, and computer vision methodologies selected from the group consisting of Harris corner detection, Shi-Tomasi corner detection, Scale-Invariant Feature Transform (SIFT), Speeded-Up Robust Features (SURF), Features from Accelerated Segment Test (FAST), and Oriented FAST and Rotated BRIEF (ORB);
   determining, by an operating system emulator, simulated energy consumption data of one or more computing devices of the computer vision component and the one or more sensors of the XR device based on operation of the computer vision component while generating the simulated tracking data; and determining by the operating system emulator using the energy consumption data, simulated thermal condition data including a thermal load and a consequent thermal condition including temperatures of portions of the XR device associated with the one or more computing devices and the one or more sensors; and providing, by the content creation platform to a user, the simulated energy consumption data and the simulated thermal condition data of the XR device.

* * * * *